(12) United States Patent
Huemoeller et al.

(10) Patent No.: US 6,967,124 B1
(45) Date of Patent: Nov. 22, 2005

(54) IMPRINTED INTEGRATED CIRCUIT SUBSTRATE AND METHOD FOR IMPRINTING AN INTEGRATED CIRCUIT SUBSTRATE

(75) Inventors: Ronald Patrick Huemoeller, Chandler, AZ (US); Sukianto Rusli, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 836 days.

(21) Appl. No.: 09/884,193

(22) Filed: Jun. 19, 2001

(51) Int. Cl.[7] ............... H01L 21/44; H01L 21/48; H01L 21/50
(52) U.S. Cl. .................... 438/108; 438/118
(58) Field of Search ............... 438/108, 118, FOR 369

(56) References Cited

U.S. PATENT DOCUMENTS

| | | |
|---|---|---|
| 4,532,419 A | 7/1985 | Takeda |
| 4,905,124 A | 2/1990 | Banjo et al. |
| 4,974,120 A | 11/1990 | Kodai et al. |
| 5,247,429 A | 9/1993 | Iwase et al. |
| 5,463,253 A | 10/1995 | Waki et al. |
| 5,474,957 A | 12/1995 | Urushima |
| 5,474,958 A | 12/1995 | Djennas et al. |
| 5,574,309 A | 11/1996 | Papapietro et al. |
| 5,581,498 A | 12/1996 | Ludwig et al. |
| 5,674,785 A | 10/1997 | Akram et al. |
| 5,739,581 A | 4/1998 | Chillara et al. |
| 5,739,585 A | 4/1998 | Akram et al. |
| 5,742,479 A | 4/1998 | Asakura |
| 5,784,259 A | 7/1998 | Asakura |
| 5,798,014 A | 8/1998 | Weber |
| 5,822,190 A | 10/1998 | Iwasaki |
| 5,835,355 A | 11/1998 | Dordi |
| 5,894,108 A | 4/1999 | Mostafazadeh et al. |
| 5,903,052 A | 5/1999 | Chen et al. |
| 5,952,611 A | 9/1999 | Eng et al. |
| 6,013,948 A | 1/2000 | Akram et al. |
| 6,034,427 A | 3/2000 | Lan et al. |
| 6,040,622 A | 3/2000 | Wallace |
| 6,060,778 A | 5/2000 | Jeong et al. |
| 6,072,243 A | 6/2000 | Nakanishi |

(Continued)

FOREIGN PATENT DOCUMENTS

| | | |
|---|---|---|
| JP | 05136323 A | 1/1993 |
| JP | 05109975 A | 3/1993 |

(Continued)

Primary Examiner—George Fourson
Assistant Examiner—Michelle Estrada
(74) Attorney, Agent, or Firm—Weiss, Moy & Harris, P.C.

(57) ABSTRACT

A die-attach method and assembly using film and epoxy bonds speeds manufacturing for large die assemblies while providing improved bond characteristics. An adhesive film defining an epoxy flow mask is attached to the die or substrate, epoxy is dispensed within the epoxy flow mask area and the die is then bonded to the substrate. The film controls the flow of the epoxy, preventing spillover. Additionally, the epoxy area can be made small with respect to the die size, reducing the time required to dispense the epoxy and reducing the amount of epoxy material required.

24 Claims, 8 Drawing Sheets

U.S. PATENT DOCUMENTS

| | | |
|---|---|---|
| 6,122,171 A | 9/2000 | Akram et al. |
| 6,127,833 A | 10/2000 | Wu et al. |
| 6,160,705 A | 12/2000 | Stearns et al. |
| 6,172,419 B1 | 1/2001 | Kinsman |
| 6,184,463 B1 | 2/2001 | Panchou et al. |
| 6,214,641 B1 | 4/2001 | Akram |
| 6,235,554 B1 | 5/2001 | Akram et al. |
| D445,096 S | 7/2001 | Wallace |
| D446,525 S | 8/2001 | Okamoto et al. |
| 6,395,578 B1 | 5/2002 | Shin et al. |

FOREIGN PATENT DOCUMENTS

| | | |
|---|---|---|
| JP | 07017175 A | 1/1995 |
| JP | 08190615 A | 7/1996 |
| JP | 10-334205 | 12/1998 |

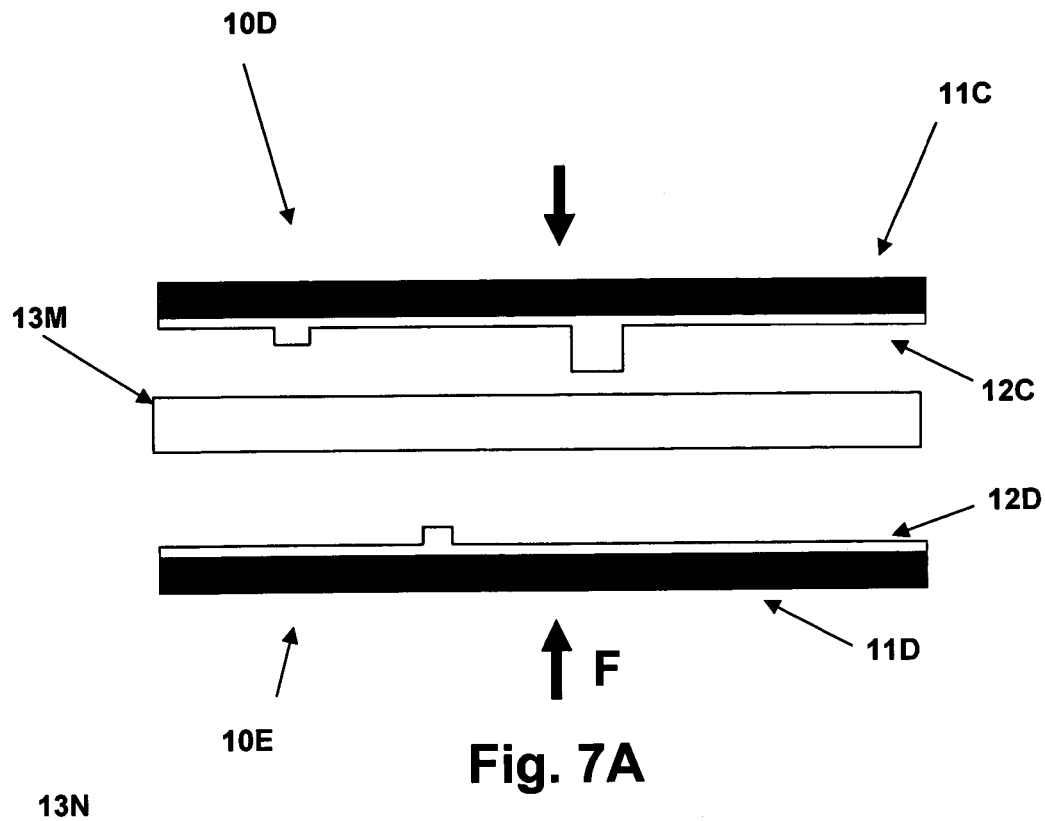
Fig. 7A
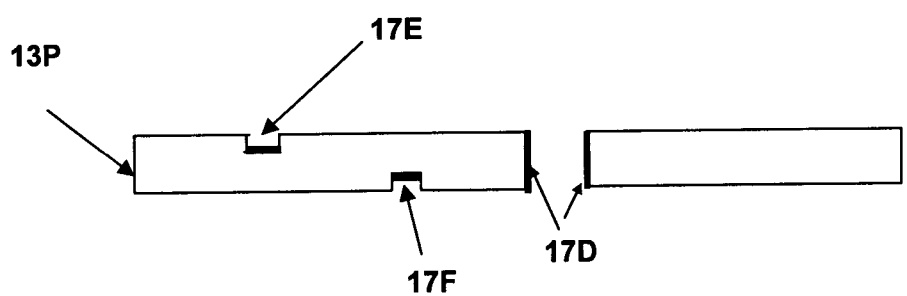
Fig. 7B
Fig. 7C

IMPRINTED INTEGRATED CIRCUIT SUBSTRATE AND METHOD FOR IMPRINTING AN INTEGRATED CIRCUIT SUBSTRATE

FIELD OF THE INVENTION

The present invention relates generally to semiconductor packaging, and more specifically, to An imprinting method and an imprinted substrate for providing electrical and mechanical connection to integrated circuit dies.

BACKGROUND OF THE INVENTION

Semiconductors and other electronic and opto-electronic assemblies are fabricated in groups on a wafer. Known as "dies", the individual devices are cut from the wafer and are then bonded to a carrier. The dies must be mechanically mounted and electrically connected to a circuit. For this purpose, many types of packaging have been developed, including "flip-chip", ball grid array and leaded grid array among other mounting configurations. These configurations typically use a planar printed circuit etched on the substrate with bonding pads and the connections to the die are made by either wire bonding or direct solder connection to the die.

The resolution of the printed circuit is often the limiting factor controlling interconnect density. Photo-etch and other processes for developing a printed circuit on a substrate have resolution limitations and associated cost limitations that set the level of interconnect density at a level that is less than desirable for interfacing to present integrated circuit dies that may have hundreds of external connections.

As the density of circuit traces interfacing an integrated circuit die are increased, the inter-conductor spacing must typically be decreased. However, reducing inter-conductor spacing has a disadvantage that migration and shorting may occur more frequently for lowered inter-conductor spacings, thus setting another practical limit on the interconnect density.

Therefore, it would be desirable to provide a method and substrate having improved interconnect density with a low associated manufacturing cost. It would further be desirable to provide a method and substrate having reduced susceptibility to shorting and migration between conductors.

SUMMARY OF THE INVENTION

An imprinted substrate and a method for imprinting a substrate use imprinting to generate a circuit pattern within a substrate. A substrate is embossed using a tool formed in the shape of the desired circuit pattern and conductor is applied to the embossed pattern.

BRIEF DESCRIPTION OF THE DRAWINGS

FIGS. 7A–7C are pictorial diagrams depicting various stages of preparation of a substrate in accordance with other alternative embodiments of the invention.

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

Figure 1:
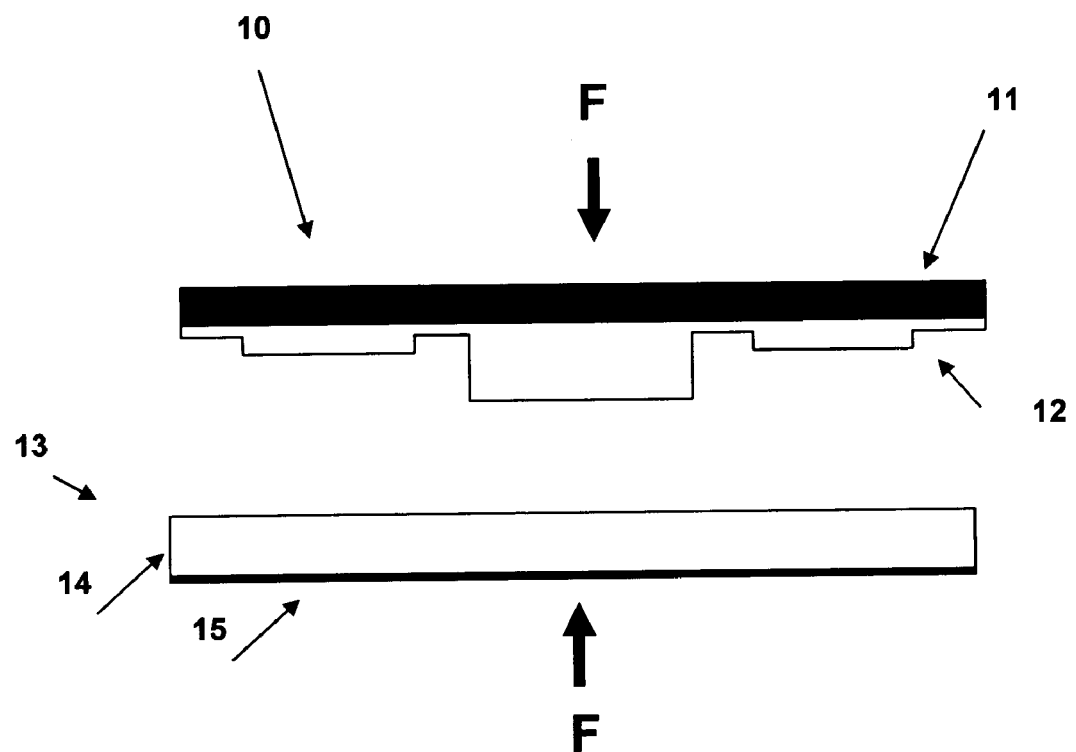
FIG. 1 is a pictorial diagram depicting a substrate and a tool for embossing in accordance with an embodiment of the invention.

Referring now to the figures and in particular to FIG. 1, a substrate 13 and an embossing tool 10 in accordance with an embodiment of the present invention are depicted. Embossing tool 10 is used to form substrate 13 in a novel process that permits embedding circuits beneath the top surface of substrate 13 and isolating the circuits in channels. Embossing tool 10 comprises a machine having a plate 11 for supporting a thin metal tool foil 12. Tool foil 12 is stamped to form an outline that conforms to a reverse image of desired contour of the top of substrate 13 after processing. A force F is applied between substrate 13 and plate 11 and the substrate material flows to conform to the contour of tool foil 12. Substrate 13 comprises a resin layer 14 that is deformable by the above-described embossing technique and a backing layer of copper 15. While the embodiment of FIG. 1 depicts single-sided embossing of a substrate having a backing layer, other embodiments of the invention extend to stand-alone substrates embossed from a resin material having no backing layer. Both single-sided and double-sided embossing processes may be used and the resulting circuits may form plated-through holes, embedded circuit traces, etched circuit traces and vias. All of the techniques illustrated in the embodiments of the invention may be applied to both sides of a substrate that has no backing layer, or has resin layers deposited on both sides of a metallic backing layer. Suitable materials for an embossable substrate are plastic resins such as PLASKON SMT-B-1RC, NITTO HC100XJAA or Liquid Crystal Polymers (LCPs) such as Rogers R/MAX 3700, R/MAX 3800, BIAC CC, or SUPEREX.

The embossing tool foil can be made with existing processes that are used in the formation of stamps for manufacturing compact discs (CDs). In the CD manufacturing process, metal foil is stamped using a master that is created for the production of multiple foils. The foils are then attached (embedded) in a polymer resin to support the foils. To support the process of the present invention, metal foils can be made in the same manner, but may be reused.

Figure 2A:
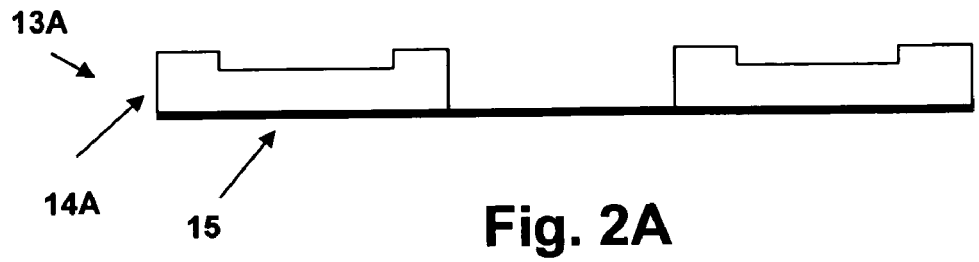
FIGS. 2A–2D are pictorial diagrams depicting various stages of preparation of a substrate in accordance with an embodiment of the invention.
Figure 2B:
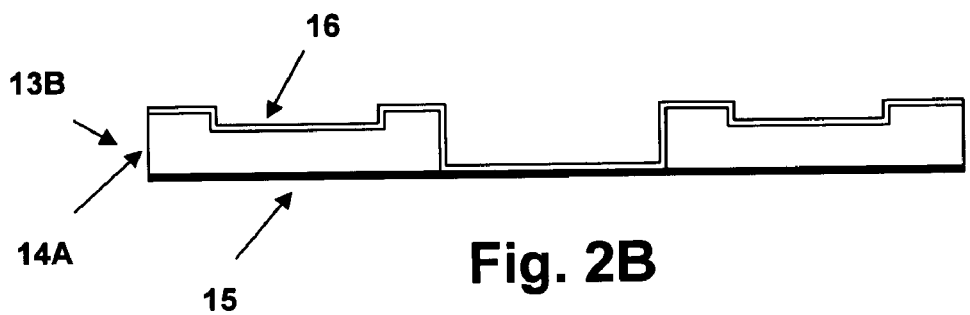
Figure 2C:
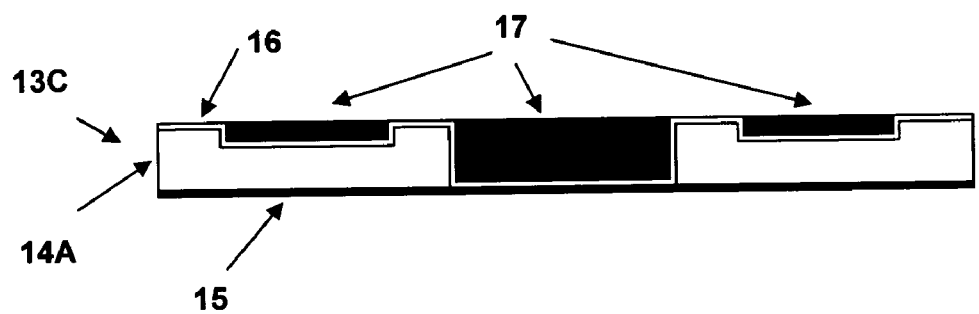
Figure 2D:
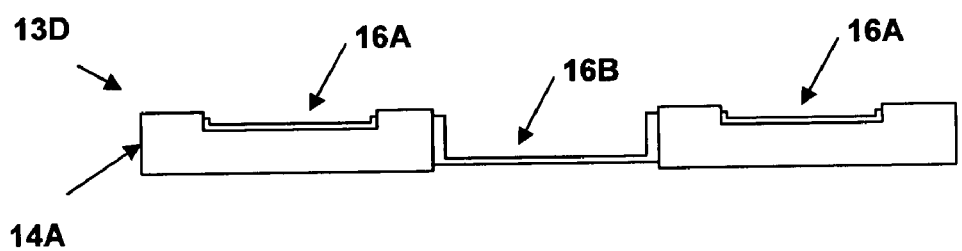

Referring now to FIG. 2A, the first stage in the preparation of substrate 13 in accordance with an embodiment of the present invention. Substrate 13A has been deformed by tool foil 12 such that voids and indentations in accordance with the figure are generated in resin layer 14. Referring now to figure 2B, copper plating 16 is seed plated or electrolytically deposited on the surface of substrate 13A to form plated substrate 13B. Next, as depicted in FIG. 2C, a permanent etchant resist material is applied to substrate 13B and is planed to conform to the top of copper plating 16. Then, as illustrated in FIG. 2D, the copper plating 16 is etched and the permanent resist is removed, leaving a circuit channel 16A and a conductive post mounting area 16B for mounting a flip chip mechanical bonding post. Circuit channel 16A can be used for electrically connecting terminals of a flip-chip package, or may be circuit traces extending out of the plane of the figures for routing circuit traces.

While the figures illustrate two conductive circuit channels 16A, the figures are depicting only a portion of the total substrate. More than a hundred circuit channels 16A will generally be used in an integrated circuit design and may be oriented in any direction within the surface of substrate 13. Additionally, materials other than copper may be used, depending on the process used. For example if etching is not necessary for a particular circuit, gold foil may be applied to the channels formed in an embossed substrate. The present invention provides a process for forming circuits within channels in a substrate that are below the top surface of the substrate. This an improvement over the present state of the art, which generally provides only surface conductors. The channels formed by embossing place the conductors below the surface and the conductors are thereby insulated from adjacent conductors by the substrate.

Figure 3:
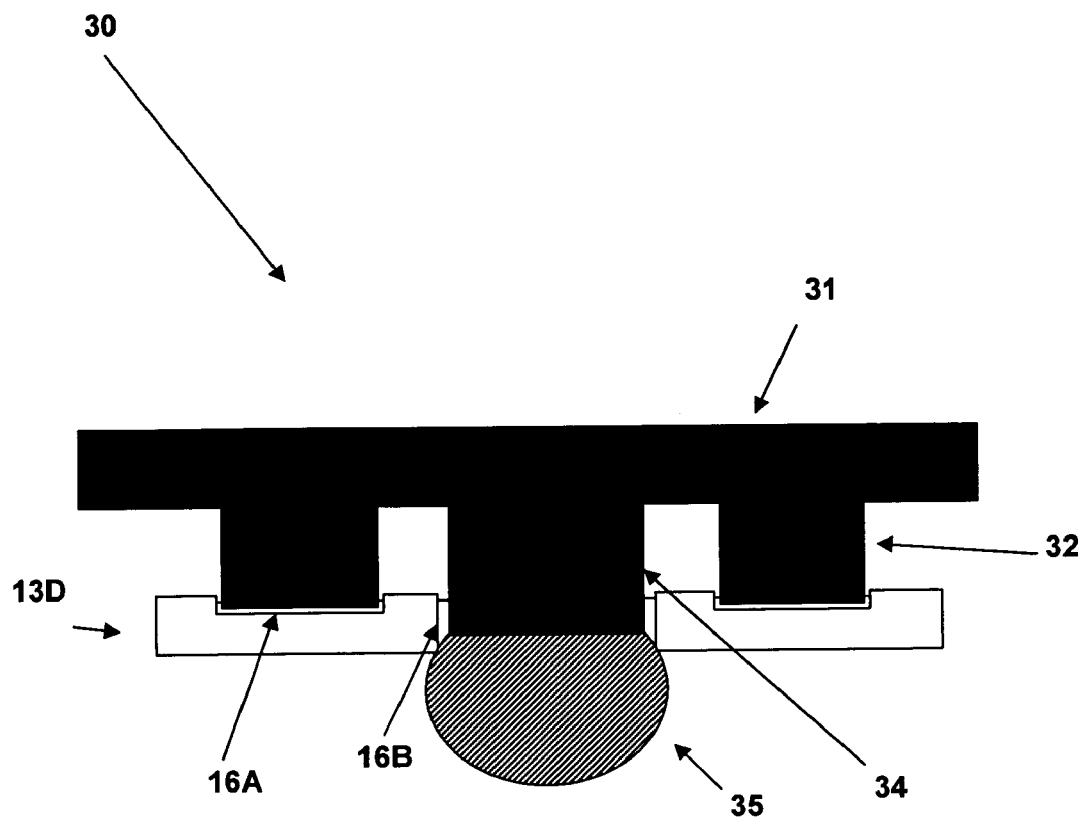
FIG. 3 is a pictorial diagram depicting an integrated circuit in accordance with an embodiment of the invention.

Referring now to FIG. 3, an integrated circuit 30 in accordance with an embodiment of the invention is depicted. A flip-chip die 31 having electrical terminal posts 32 and a mounting post 34 is attached to substrate 13D by a solder ball 35. The solder ball provides electrical and thermal connection from flip-chip die 31 to substrate 13D via post mounting area 16B formed from remaining copper conductor 16. Channels 16A contact electrical terminal posts 32, providing contact to the electrical terminals. Since the circuits forming channels 16A may extend in the plane of the figure to any point on substrate 13D, routing of the electrical connections to terminal posts 32 may be made to other locations on substrate 13D. Multiple dies may be mounted on substrate 13D and the channels 16A used to interconnect the various dies.

Figure 4A:
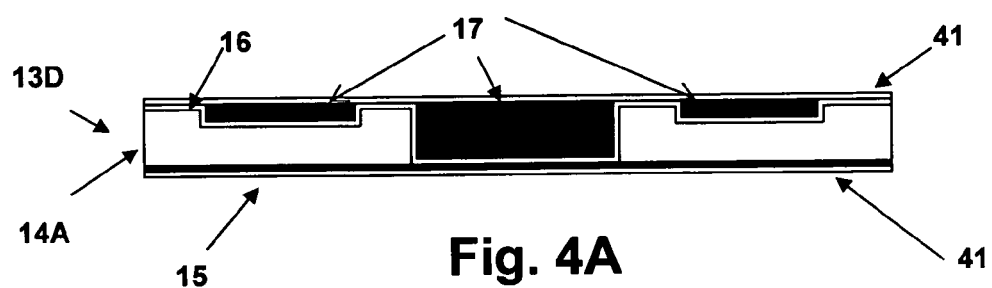
FIGS. 4A–4F are pictorial diagrams depicting various stages of preparation of a substrate in accordance with an alternative embodiment of the invention.
Figure 4B:
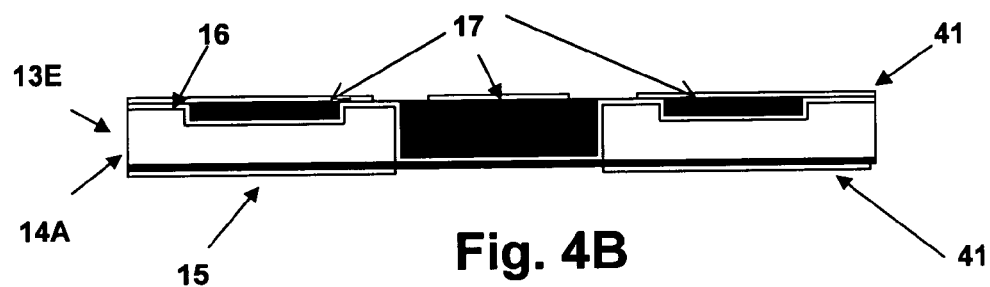
Figure 4C:
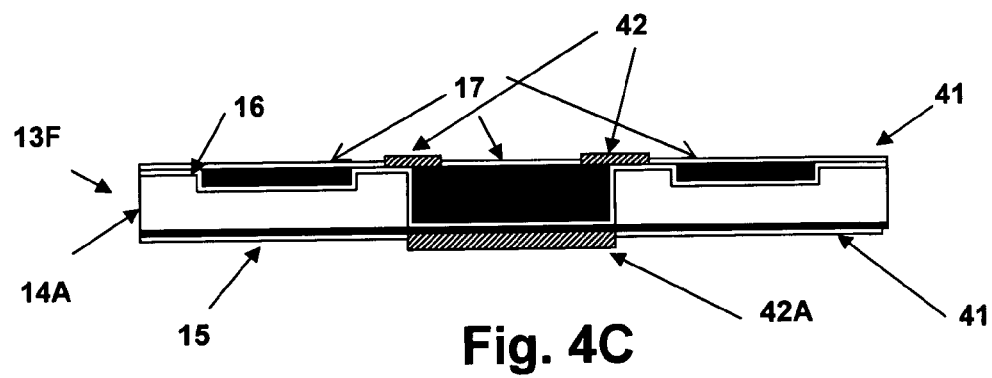
Figure 4D:
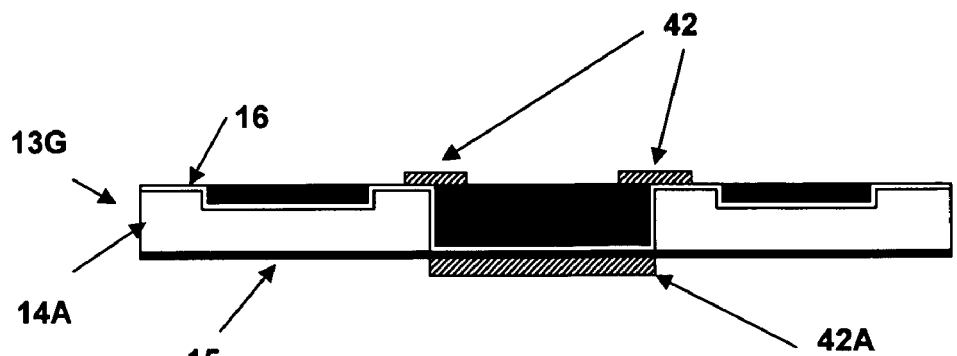
Figure 4E:
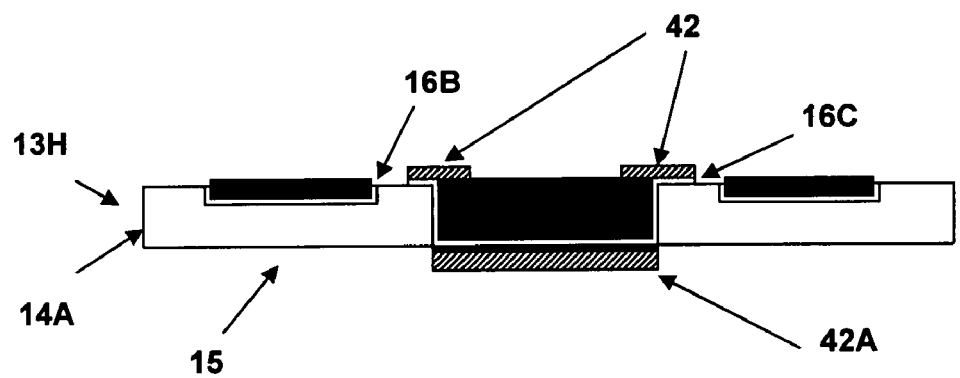
Figure 4F:
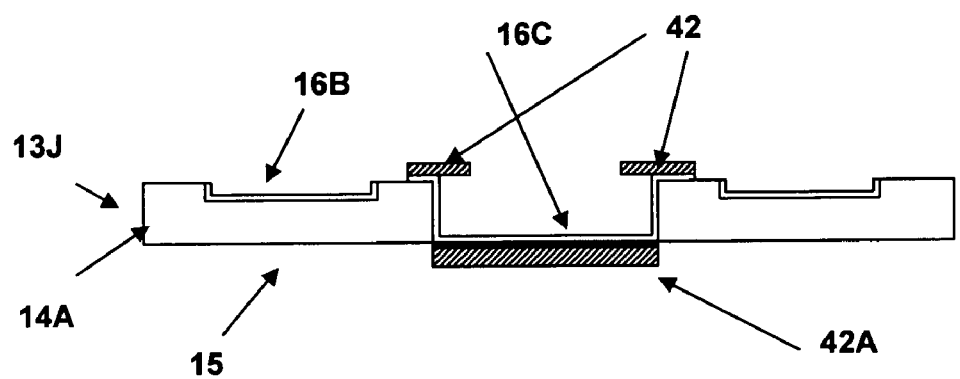

Referring now to FIG. 4A, an alternative embodiment of the present invention is depicted. Following the process of FIGS. 2A–2C, substrate 13C may be prepared in an alternative process to that illustrated above. Substrate 13C of FIG. 2C is coated on both sides with a photo-sensitive etch resist material 41. Next as illustrated in FIG. 4B, portions of etch resist material 17 is removed by an imaging process, exposing copper plating 16 in areas for subsequent plating. Then, as illustrated by FIG. 4C, the exposed areas of copper plating 16 are plated with a material resistant to chemical etchant such as nickel/gold to form wire bonding pads 42. The remaining photo-etch resist material 17 is removed, yielding substrate 13G of FIG. 4D. Circuit material 16 is then etched to remove the portions uncovered by permanent etch resist, forming channels 16B and interconnect 16C of substrate 13H of FIG. 4E. Finally, the permanent etch resist material is removed, leaving the prepared substrate 13J of FIG. 4F.

Figure 5:
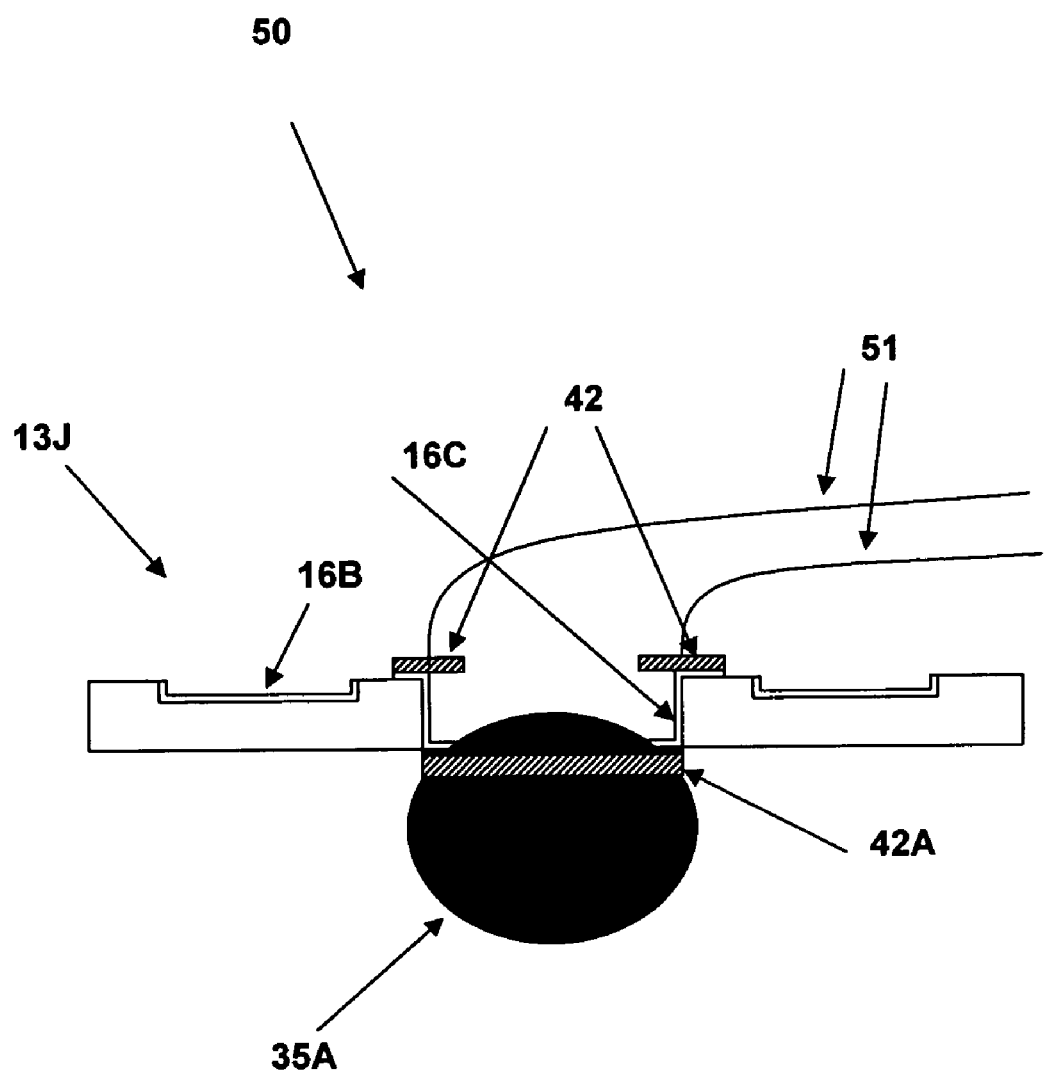
FIG. 5 is a pictorial diagram depicting an integrated circuit in accordance with an alternative embodiment of the invention.

Referring now to FIG. 5, an integrated circuit 50 is depicted in accordance with an alternative embodiment of the invention. Prepared substrate 13J is connected to a die (not shown) by wires 51 that are bonded to wire bonding pads 42, providing an electrical connection to the die. A ball grid array (BGA) solder ball is applied to the plated area 42A on the backside of substrate 13J and is electrically connected to wire bonding pads 42 via interconnect 16C. Solder ball 35A provides an electrical terminal for external connection to other circuits as in a typical BGA arrangement. Channels 16B are used to route connections within substrate 13J and may provide connection to flip-chip mounted dies in accordance with the earlier-described embodiment of the invention, forming a substrate that embodies both embodiments of the present invention.

Figure 6A:
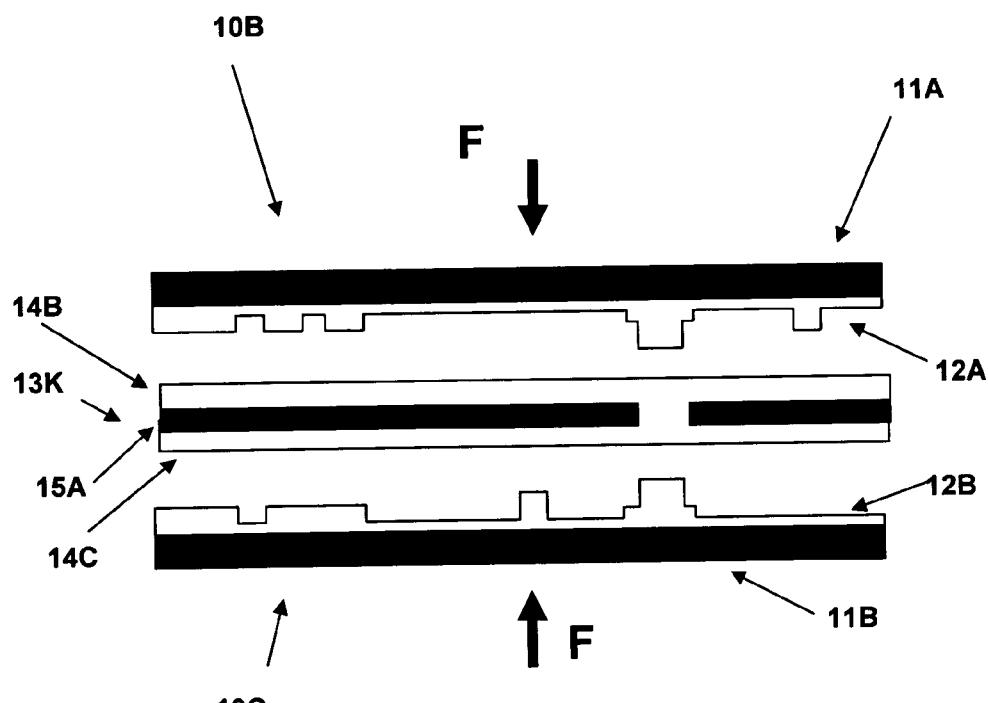
FIGS. 6A–6C are pictorial diagrams depicting various stages of preparation of a substrate in accordance with alternative embodiments of the invention.

Referring now to FIG. 6A, an alternative double-sided substrate preparation is disclosed in accordance with an embodiment of the invention. Embossing tool 10B comprises a machine having a top plate 11A for supporting a thin metal tool foil 12A for forming the top of substrate 13K. Tool foil 12A is stamped to form an outline that conforms to a reverse image of desired contour of the top of substrate 13K after processing. Embossing tool 10C comprises a machine having a bottom plate 11B for supporting a thin metal tool foil 12B for forming the bottom of substrate 13K. Tool foil 12B is stamped to form an outline that conforms to a reverse image of desired contour of the top of substrate 13K after processing. A force F is applied between embossing tool 10B and embossing tool 10C, embossing substrate 13K so that the substrate material flows to conform to the contour of tool foils 12A and 12B. Substrate 13K as depicted comprises a top resin layer 14B and a bottom resin layer 14C deposited over a metal layer 15A of copper. The metal layer is perforated by an resist-etch process or other means, so that plated through holes may be made through substrate 13K, but a double-sided substrate may be embossed without metal layer 15A or with multiple metal layers. Metal layer 15A may be used to provide an electrical and thermal conductive path for devices mounted on substrate 13K after the substrate is prepared.

Figure 6B:
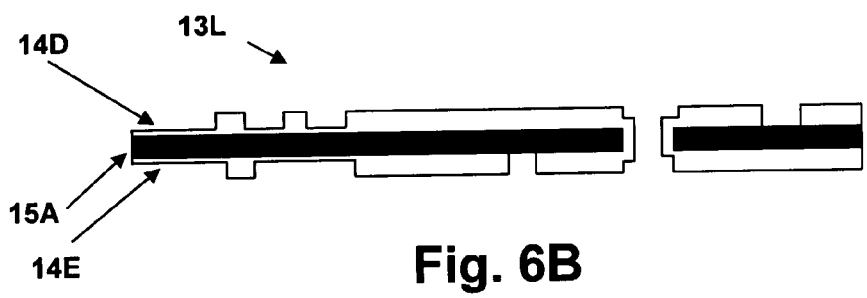
Figure 6C:
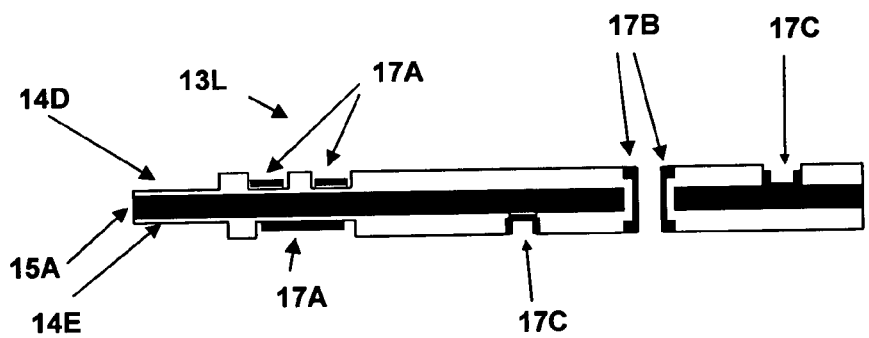

Referring now to FIG. 6B, substrate 13L is depicted after embossing in accordance with FIG. 6A. Depressions are made through substrate 13L for generation of plated-through holes, through to metal layer 15A for contact vias to metal layer 15A, and within resin layer 14B for circuit traces. Substrate 13L is then plated by depositing metal, adding etch resist and then etching as described above for single-sided substrates. Referring now to FIG. 6C, the final plated substrate is depicted. Plated-through hole 17B provides insulation from the metal layer 15A, since the embossing process removed an area of substrate 13L that was smaller in diameter than the perforation in metal layer 15A, but contact could be made with metal layer 15A for other plated-through connections. Via 17C provides contact to metal layer 15A from one side of substrate 13L and traces 17C provide circuit paths. Many combinations of embossing and etching may be used to provide multi-layer substrates with or without incorporated metal planes.

Referring now to FIG. 7A, an alternative double-sided substrate preparation without a metal layer is disclosed in accordance with yet another embodiment of the invention. Embossing tool 10D comprises a machine having a top plate 11C for supporting a thin metal tool foil 12C for forming the top of substrate 13M. Tool foil 12C is stamped to form an outline that conforms to a reverse image of desired contour of the top of substrate 13M after processing. Embossing tool 10E comprises a machine having a bottom plate 11D for supporting a thin metal tool foil 12D for forming the bottom of substrate 13M. Tool foil 12D is stamped to form an outline that conforms to a reverse image of desired contour of the top of substrate 13M after processing. A force F is applied between embossing tool 10D and embossing tool 10E, embossing substrate 13M so that the substrate material flows to conform to the contour of tool foils 12C and 12D. Substrate 13M as depicted comprises only a resin layer without metal layers.

Referring now to FIG. 7B, substrate 13N is depicted after embossing in accordance with FIG. 7A. Depressions are made completely through substrate 13N for generation of plated-through holes, and within substrate 13N for circuit traces. Substrate 13N is then plated by depositing metal, adding etch resist and then etching as described above for single-sided substrates.

Referring now to FIG. 7C, the final plated substrate is depicted. Plated-through hole 17D and circuit traces 17E and 17F have been added via the plating and selective etching processes described above for the single-sided embodiment of the invention.

The above description of embodiments of the invention is intended to be illustrative and not limiting. Other embodiments of this invention will be obvious to those skilled in the art in view of the above disclosure and fall within the scope of the present invention.

What is claimed is:

1. A method for manufacturing an integrated circuit substrate, comprising:
    embossing a top side of the substrate with a tool having features defining a reverse image of channels for addition of circuit material;
    adding circuit material within channels formed by the embossing of the top side of the substrate;
    embossing a bottom side of the substrate with a second tool having features defining a reverse image of bottom channels for addition of bottom circuit material; and
    adding circuit material within the bottom channels formed by the embossing of the bottom side of the substrate.

2. An integrated circuit manufactured by the method of claim 1.

3. The method of claim 1, wherein the substrate comprises a top insulating layer and bottom insulating layer bonded on opposite sides of a metal layer, wherein the method further comprises perforating the metal layer prior to bonding the insulating layers to the metal layer.

4. The method of claim 3, wherein the perforating is performed by etching the metal layer.

5. The method of claim 1, wherein the second tool has features for creating voids through the substrate from the channels to the bottom channels, and wherein the method further comprises depositing circuit material within the voids for electrically connecting circuit material within the channels to circuit material within the bottom channels.

6. The method of claim 1, further comprising mounting a flip-chip die having electrical contacts on the bottom side by inserting the electrical contacts within the channels formed by the embossing.

7. The method of claim 1, wherein the embossing forms a void through the substrate for insertion of a mounting post, and further comprising:
    mounting a die having a retaining post on a top side of the substrate, by inserting the retaining post through the void; and
    soldering the retaining post to circuit material on the bottom side of the substrate.

8. The method of claim 1, wherein the adding is performed by electroplating copper on the top side of the substrate and wherein the method further comprises:
    depositing a resist material on top of areas of the circuit material; and
    etching the electroplated copper to form an electrical circuit within the areas.

9. The method of claim 1, wherein the adding is performed by electroplating copper on the top side of the substrate, and wherein the method further comprises:
    plating areas of the electroplated copper with a metal resistant to the etching within areas of the circuit material; and
    etching the electroplated copper, wherein the electroplated copper is retained under the areas.

10. The method of claim 1, further comprising providing a homogeneous single sheet of dielectric material, and wherein the embossing embosses the top side of the dielectric material to form the channels.

11. The method of claim 10, wherein the embossing embosses channels having sides extending to a plane defining a top surface of the dielectric sheet and a bottom beneath the plane.

12. The method of claim 11, wherein the embossing embosses channels having a bottom of the channels located at a second plane substantially above the bottom surface of the dielectric sheet.

13. The method of claim 12, further comprising bonding the dielectric sheet to a metal layer prior to the embosssing.

14. The method of claim 1, wherein the embossing embosses channels having sides extending to a plane defining a top surface of the substrate and a bottom beneath the plane.

15. The method of claim 14, wherein the embossing embosses channels having a bottom of the channels located at a second plane substantially above the bottom surface of the substrate.

16. The method of claim 1, wherein the adding comprises applying a gold foil within the channels.

17. The method of claim 1, further comprising electrically connecting an integrated circuit die to the circuit material within the channels.

18. The method of claim 17, wherein the electrically connecting is performed by adding bonding wires between the circuit material and electrical terminals of the die.

19. The method of claim 17, wherein the electrically connecting is performed by directly bonding electrical terminals of the die to the circuit material.

20. The method of claim 1, further comprising prior to the embossing, stamping a metal foil to form the reverse image of the channels.

21. The method of claim 20, further comprising mounting the stamped metal foil to a tooling plate.

22. A method for manufacturing an integrated circuit, comprising:
    first embossing a top side of a top outer dielectric layer of a substrate with a tool having features defining a reverse image of top channels for addition of circuit material, the top channels having sides extending to a plane defining a top surface of the substrate and a bottom beneath the plane, wherein the bottom of the top channels is located at a second plane substantially above the bottom surface of the top outer dielectric layer;
    adding circuit material within the channels formed by the embossing; and
    electrically connecting an integrated circuit die to the circuit material within the channels.

23. The method of claim 22, further comprising second embossing a bottom side of a bottom outer dielectric layer of the substrate with a tool having features defining a reverse image of bottom channels for addition of circuit material, the bottom channels having sides extending to a third plane defining a bottom surface of the substrate and a bottom beneath the third plane, wherein the top of the bottom channels is located at a second plane substantially below the top surface of the bottom outer dielectric layer; and adding bottom circuit material within bottom channels.

24. The method of claim 23, further comprising providing a homogeneous single sheet of dielectric material, and wherein the first embossing embosses the top side of the dielectric sheet to form the top channels and the second embossing embosses the bottom side of the dielectric sheet to form the bottom channels.

* * * * *